US007142017B2

(12) United States Patent  (10) Patent No.: US 7,142,017 B2
Chen  (45) Date of Patent: Nov. 28, 2006

(54) HIGH-VOLTAGE-TOLERANT FEEDBACK COUPLED I/O BUFFER

(75) Inventor: Ker Min Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 66 days.

(21) Appl. No.: 10/937,153

(22) Filed: Sep. 7, 2004

(65) Prior Publication Data

US 2006/0049847 A1  Mar. 9, 2006

(51) Int. Cl.
*H03K 19/094* (2006.01)
*H03K 19/0175* (2006.01)
*H03K 19/082* (2006.01)
*H03K 19/20* (2006.01)
*H03F 3/26* (2006.01)

(52) U.S. Cl. ............................. 326/85; 326/87; 326/91; 326/113; 330/262

(58) Field of Classification Search ................. 326/85, 326/87, 91; 330/262
See application file for complete search history.

(56) References Cited

U.S. PATENT DOCUMENTS

| | | | |
|---|---|---|---|
| 5,825,206 A * | 10/1998 | Krishnamurthy et al. ...... | 326/81 |
| 5,864,243 A | 1/1999 | Chen et al. | |
| 6,121,795 A * | 9/2000 | Curd et al. ................... | 326/83 |
| 6,130,556 A * | 10/2000 | Schmitt et al. ............... | 326/81 |
| 6,313,661 B1 | 11/2001 | Hsu | |
| 6,313,672 B1 * | 11/2001 | Ajit et al. ................... | 327/112 |
| 6,429,683 B1 * | 8/2002 | Miller et al. .................. | 326/80 |
| 6,768,367 B1 * | 7/2004 | Meadows et al. ............ | 327/333 |

OTHER PUBLICATIONS

Hector Sanchez et al., "A Versatile 3.3/2.5/1.B-V CMOS I/O Driver Built in a 0.2-μm, 3.5-nm Tox, 1.8-V CMOS Technology", IEEE Journal of Solid-State Circuits, Nov. 1999, pp. 1501-1511, vol. 34, No. 11.
Lawrence T. Clark, "A High-Voltage Output Buffer Fabricated on a 2V CMOS Technology", 1999, pp. 61-62, 1999, 4-930813-95-6/99, 1999 Symposium on VLSI Circuits Digest of Technical Papers, no month.
John Connor et al., "Dynamic Dielectric Protection For I/O Circuits Fabricated in a 2.5V CMOS Technology Interfacing to a 3.3V LVTTL Bus", 1997, pp. 119-120, 4-930813-76-X, 1997 Symposium on VLSI Circuits, Digest of Technical Papers.

* cited by examiner

*Primary Examiner*—Rexford Barnie
*Assistant Examiner*—Dylan White
(74) *Attorney, Agent, or Firm*—Haynes and Boone, LLP

(57) ABSTRACT

An input/output buffer comprises an input/output pad operable to receive an input signal and transmit an output signal, an output driver coupled to the input/output pad, an input path comprising an input transistor coupled to the input/output pad operable to pass an input signal received at the input/output pad to a core circuit coupled to the input/output buffer. The input/output buffer further comprises an output path coupled to the output driver operable to pass an output signal received from the core circuit to the input/output pad, a feedback path coupled to the input transistor in the input path and operable to cut off the output path during input mode, and a biasing circuit coupled to selected transistors in the output path, feedback path and output driver.

19 Claims, 4 Drawing Sheets

HIGH-VOLTAGE-TOLERANT FEEDBACK COUPLED I/O BUFFER

BACKGROUND

An integrated circuit (IC) comprises one or more devices (e.g., circuit components) on a semiconductor substrate using a myriad of fabrication processes. As fabrication processes and materials improve, semiconductor device geometries have continued to decrease in size since such devices were first introduced several decades ago. For example, current fabrication processes are producing devices having feature sizes (e.g., the smallest component (or line) that may be created using the process) of less than 65 nm. However, the reduction in size of device geometries frequently introduces new challenges that need to be overcome.

As microelectronic device geometries scale down towards 20 nm, the electrical efficiency of integrated circuit design becomes an issue that impacts product performance. For example, driven by the need to reduce power consumption, the nominal operating supply voltage of these devices has been pushed to lower voltage levels such as around 3.3 volts or near 1.0 volts. However, many integrated devices and logic testing devices do not operate at these low voltage levels, making the interface between these low power devices and integrated devices a challenging problem.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
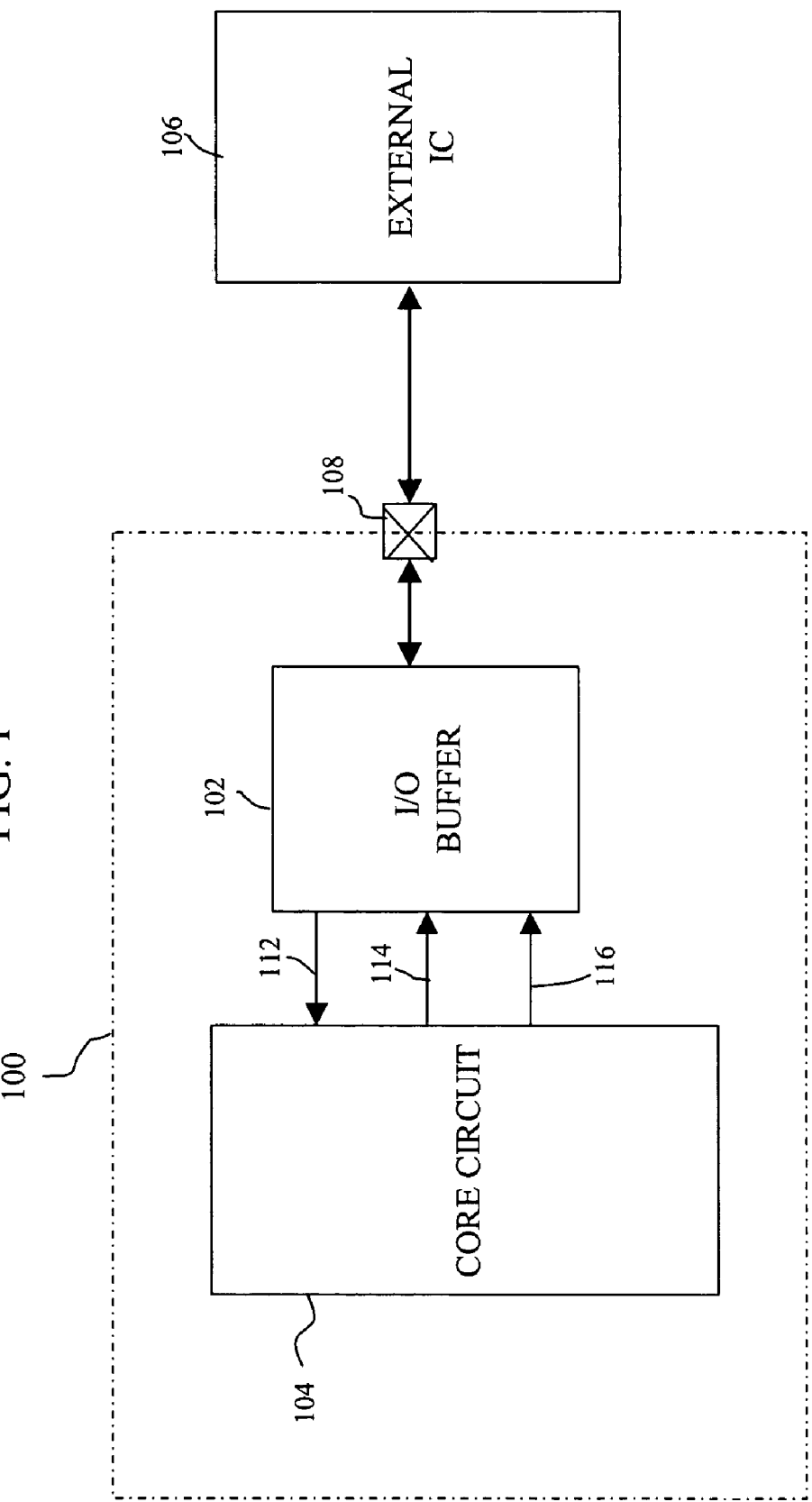
FIG. 1 is a simplified functional block diagram of one embodiment of an input/output circuit.

The present disclosure relates generally to an integrated circuit device and method for fabrication, and more specifically to an integrated circuit with an input/output buffer circuit. It is understood, however, that the following disclosure provides many different embodiments or examples. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a simplified functional block diagram of one embodiment of an integrated circuit 100 or a portion thereof. Integrated circuit 100 may be a low power circuit that operates at a low voltage, for example, at a supply voltage level, $V_{DD}$, of 3.3 volts or lower. Integrated circuit 100 comprises an input/output (I/O) buffer or circuit 102 coupled to a core circuit 104. Core circuit 104 may perform a myriad of operations and functions and may include a number of logic, analog, and other devices and circuits. In particular, core circuit 104 may include transistors, diodes, pre-amplifiers, operational amplifiers, NAND, NOR, buffers, inverters, memory, and/or other circuits. Core circuit 104 may also include a level-shifter, which may be adapted for transforming a voltage signal in one voltage range to a second voltage signal in a second voltage range. In particular, a level-shifter may shift a voltage between a high voltage range, 0 to 5 volts, and a low voltage range, 0 to about 1 volt or 3.3 volts, for example. Core circuit 104 may also include devices for providing signal amplification.

I/O buffer circuit 102 may receive a data input signal 114 and an output enable signal 112 from core circuit 104. I/O buffer circuit 102 may further provide a control signal 116 to core circuit 104. I/O buffer circuit 102 is operable to provide electrical enhancement of the signal integrity and operational efficiency of integrated circuit 100. For example, I/O buffer circuit 102 may provide control of the slew rate, and adaptation of high and/or low impedance loads to core circuit 104 and/or other circuits.

I/O buffer circuit 102 is coupled to a pad 108 that enables integrated circuit 100 to be electrically coupled to one or more external circuits and integrated circuits 106. External integrated circuits 106 may perform a variety of functions and operations in cooperation with integrated circuit 100. External integrated circuit 100 may also represent a data bus or some other form of connectivity between integrated circuits.

Figure 2:
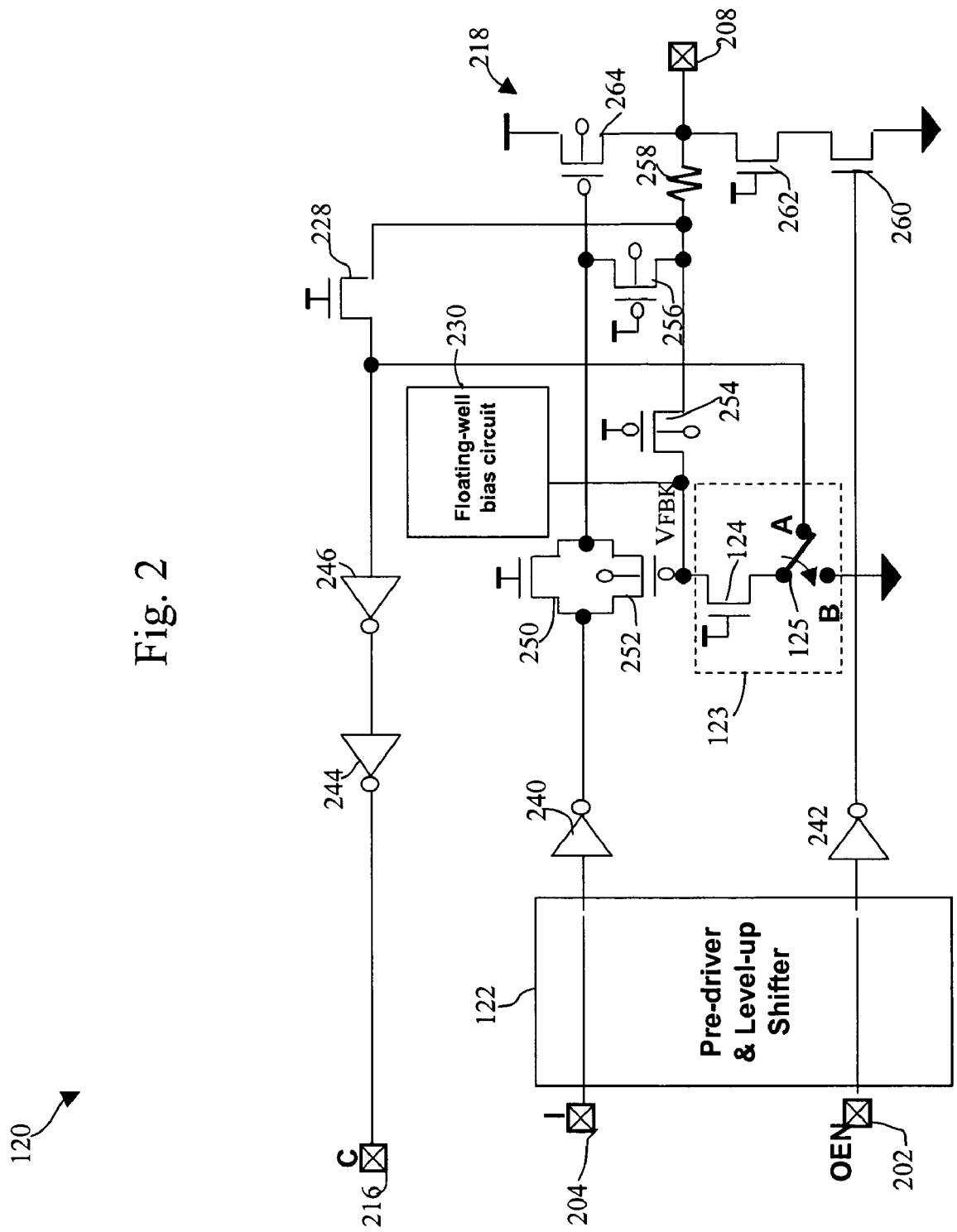
FIG. 2 is a schematic diagram illustrating the functionality of an input/output buffer circuit.

FIG. 2 is a schematic diagram illustrating the functionality of an input/output buffer circuit 120. I/O buffer circuit 120 may perform the functionality of I/O buffer 102 in FIG. 1. An input signal 202 provides an output enable signal (OEN) to I/O buffer circuit 120, a second input signal 204 provides a data input signal (I) to I/O buffer circuit 120, and an output signal from I/O buffer circuit 200 provides a control signal (C) to core circuit 102 (FIG. 1). Output enable signal 202 may enable I/O buffer 120 to operate as a bi-directional tri-state output buffer. For example, output enable signal 202 may cause I/O buffer 120 to operate in an active state or alternatively operate as a tri-state output buffer. An I/O pad 208 provides electrical connection to external circuits and devices.

I/O buffer circuit 120 may include a pre-driver circuit 122 receiving output enable signal 202 and data input signal 204. Pre-driver circuit 122 may receive the output enable signal 202 and the data input signal 204. The output of the pre-driver circuit 122 is coupled to a first inverter 240, the output of which is coupled to a source terminal of an NMOS transistor 250 and a drain terminal of a PMOS transistor 252. The gate of transistor 250 is coupled to a supply bias voltage, $V_{BIAS}$. The drain of transistor 250 and the source of transistor 252 are coupled to a gate of a PMOS transistor 264 in an output driver 218. The drain of transistor 264 is coupled to I/O pad 208.

A feedback circuit 123 is coupled to the gate of transistor 252 and an output driver 218. The feedback circuit 123 is conceptually shown as having an NMOS transistor 124 coupled in series with a switch 125 between the gate of transistor 252 and ground or $V_{SS}$. The switch 125 is operable to couple transistor 124 to ground or $V_{SS}$ (position B) or to the data input path (position A). Thus, a feedback path to transistor 252 may be formed from pad 208, through resistor 258, transistor 228, switch 125, and transistor 124. Two serial input inverters 244 and 246 are coupled to input transistor 228 and form an input path to provide a control signal 206 that may be used by the core circuit.

Output driver 218 comprises two NMOS transistors 262 and 260 coupled in series between the source of a PMOS transistor 264 and $V_{SS}$ or ground. The gate of transistor 262 is coupled to $V_{BIAS}$, and the gate of transistor 260 is coupled to the output of an inverter 242 that is coupled to pre-driver circuit 122. Transistor 262 may function as a cascade transistor to protect transistor 260 from large voltages appearing at I/O pad 208.

NMOS transistor 250 and PMOS transistor 252 are coupled in parallel between the output of inverter 240 and the gate of transistor 264. Transistors 250 and 252 form a pass gate between the data input signal and output driver 218. The gate of transistor 250 is coupled to $V_{BIAS}$, and the gate of transistor 252 is coupled to the source of transistor 124. A PMOS transistor 254 is further coupled between the gate of transistor 252 and resistor 258. The gate of transistor 254 is coupled to supply voltage, $V_{BIAS}$. Another PMOS transistor 256 is coupled between a common point at the drain of transistor 250 and the source of transistor of 252 and the source of transistor 254. The respective N-wells of the PMOS transistors in I/O buffer circuit 120 may be coupled to a floating N-well bias circuit 230.

In operation during input mode (when output enable signal 202 is at a logic high or 3.3 volts, for example), an input path is formed from I/O pad 208, via resistor 258 and inverters 246 and 244. A feedback path is formed by transistors 228, switch 125 (in position A), and transistor 124 to node $V_{FBK}$. When I/O pad 208 is forced to a logic low level or 0 volts by a signal received from an external circuit, for example, the voltage level at node $V_{FBK}$ is also at a logic low level. This causes the floating N-wells of the PMOS transistors to be biased at 3.3 volts, for example if $V_{BIAS}$ is 3.3 volts. Input transistor 228, being ON, passes the low logic level to inverters 246 and 244 for passing on to the core circuit as an input or control signal. Both transistors 260 and 264 in output driver 218 are OFF during input mode.

When I/O pad 208 is forced to 3.3 volts during input mode, the voltage level at node $V_{FBK}$ may be about 2.7 volts due to the voltage drop across the feedback path. Accordingly, the N-well bias of the PMOS transistors is held at $V_{BIAS}$ or 3.3 volts.

When I/O pad 208 receives a 5-volt input signal, the voltage level $V_{FBK}$ may swing from 0 or 2.7 volts to about 5 volts. Thus, the floating N-wells are biased at 5 volts. Properly biasing the floating N-wells to the PMOS transistors avoids or minimizes over-voltage and leakage current problems in these transistors when a 5-volt input signal is present. These transistors also do not have gate oxide reliability issues. Transistors 250 and 252 also operate to protect pre-driver 122 when the input signal is at 5 volts. Transistor 252, in particular, is turned OFF by a high logic level at $V_{FBK}$.

In output mode, enable signal 202 is at a logic low and I/O buffer circuit 120 operates in output mode. The output of inverter 240 passes through parallel transistors 250 and 252 to turn ON or OFF transistor 264 depending on the logic level of data input signal 204. The output of inverter 242 will also follow the logic level of data input signal 204 to turn ON or OFF transistors 260. When the output of inverter 240 is at a logic high or 3.3 volts when the data input signal is at a logic low, 3.3 volts are passed to the gate of transistor 264, and a logic high signal is provided to the gate of transistor 260. Thus, transistor 264 is turned ON, transistor 260 is turned OFF, and the signal present at I/O pad 208 becomes a logic high. On the other hand, if the data input signal is low, transistor 264 is turned OFF, transistor 260 is turned ON, and the signal present at I/O pad 208 becomes a logic low. The voltage level $V_{FBK}$ is also held at a low logic level to maintain the floating N-well bias at 3.3 volts. This enables fast tri-state response time. The output logic level at I/O pad 208 thus follows the logic level of data input signal 204.

Figure 3:
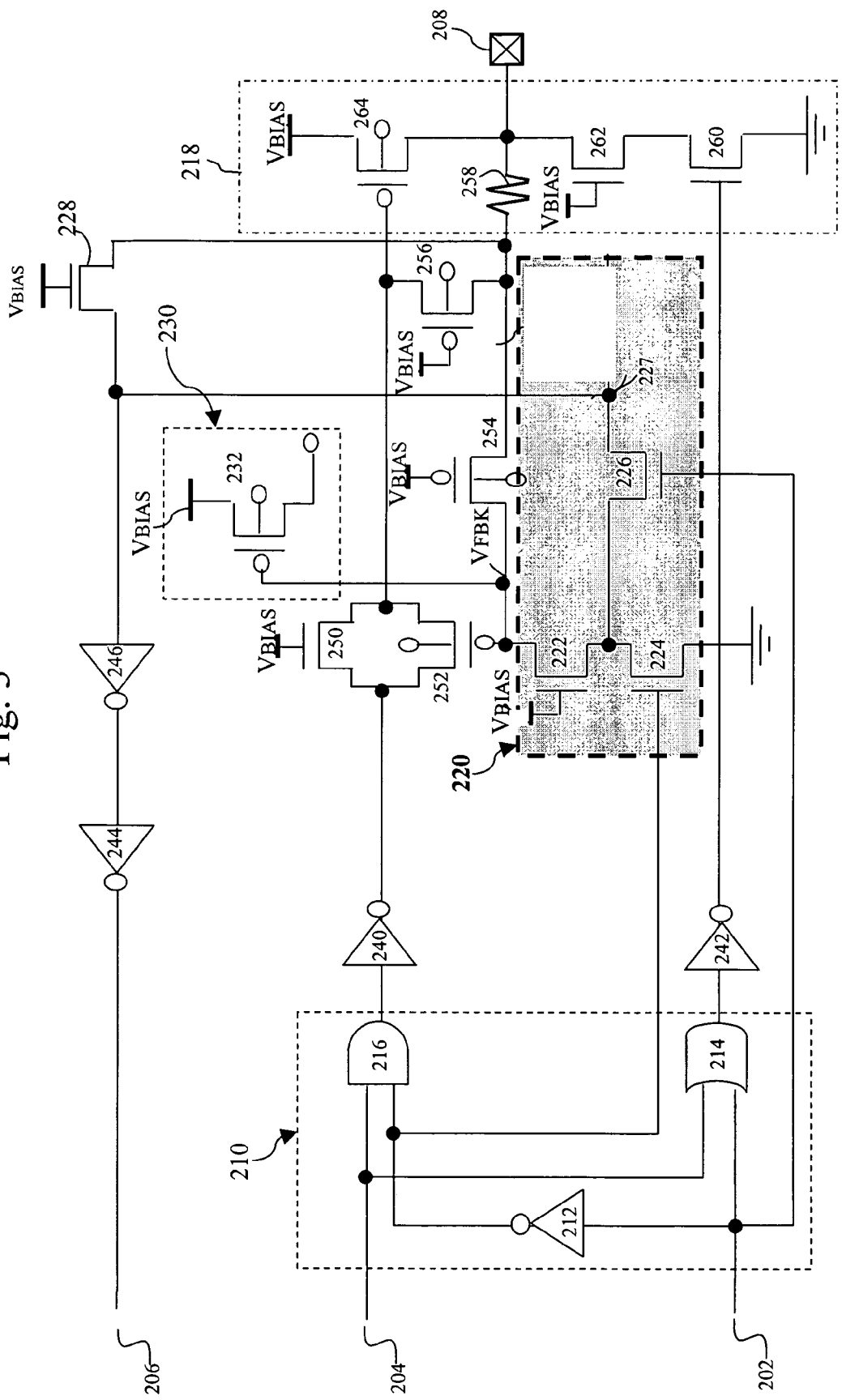
FIG. 3 is a schematic diagram of one embodiment of an input/output buffer circuit.

FIG. 3 is a schematic diagram of one embodiment of an I/O buffer circuit 200. I/O buffer circuit 200 may be one implementation of I/O buffer 102 in FIG. 1. An input signal 202 provides an output enable signal to I/O buffer circuit 200, a second input signal 204 provides a data input signal to I/O buffer circuit 200, and an output signal from I/O buffer circuit 200 provides a control signal to core circuit 102 (FIG. 1). Output enable signal 202 may enable I/O buffer 200 to operate as a bi-directional tri-state output buffer. For example, output enable signal 202 may cause I/O buffer 200 to operate in an active state or alternatively operate as a tri-state output buffer. An I/O pad 208 provides electrical connection to external circuits and devices.

I/O buffer circuit 200 may include a pre-driver circuit 210 receiving output enable signal 202 and data input signal 204. Pre-driver circuit 210 may include an inverter receiving output enable signal 202 with its output coupled to one input of an AND gate 216. An OR gate 214 also receives output enable signal 202 at one of its input terminals and data input signal 204 at its other input terminal. AND gate 216 also receives data input signal 204 at a second one of its input terminals. The output of AND gate 216 is coupled to a first inverter 240, the output of which is coupled to a source terminal of an NMOS transistor 250 and a drain terminal of a PMOS transistor 252. The gate of transistor 250 is coupled to a supply bias voltage, $V_{BIAS}$. The drain of transistor 250 and the source of transistor 252 are coupled to a gate of a PMOS transistor 264 in an output driver 218. The drain of transistor 264 is coupled to I/O pad 208.

A feedback circuit 220 is coupled to the gate of transistor 252 and output driver 218. Feedback circuit 220 includes two NMOS transistors 222 and 224 coupled in series between the gate of transistor 252 and ground or $V_{SS}$. The gate of transistor 222 is coupled to supply voltage $V_{BIAS}$, and the gate of transistor 224 is coupled to the output of inverter 212 (inverted output enable signal). Feedback circuit 220 further includes a feedback NMOS transistor 226 coupled, at its source, to the drain of transistor 222 and the source of transistor 224. The drain of feedback transistor 226 is coupled to a drain of an input NMOS transistor 228 (denoted node 227) in the input path. The gate of transistor 226 is coupled to output enable signal 202. The drain of transistor 228 is coupled to I/O pad 208 via a resistor 258. Thus a feedback path is formed from pad 208, through resistor 258, transistor 228, and transistor 222.

Output driver 218 comprises two NMOS transistors 262 and 260 coupled in series between the source of a PMOS transistor 264 and $V_{SS}$ or ground. The gate of transistor 262 is coupled to $V_{BIAS}$, and the gate of transistor 260 is coupled to the output of inverter 242. Transistor 262 may function as a cascade transistor to protect transistor 260 from large voltages appearing at the I/O pad.

NMOS transistor 250 and PMOS transistor 252 are coupled in parallel between the output of inverter 240 and the gate of transistor 264. Transistors 250 and 252 form a pass gate between the data input signal and output driver 218. The gate of transistor 250 is coupled to $V_{BIAS}$, and the gate of transistor 252 is coupled to the source of an NMOS transistor 222. A PMOS transistor 254 is further coupled between the gate of transistor 252 and resistor 258. The gate of transistor 254 is coupled to supply voltage, $V_{BIAS}$. Another PMOS transistor 256 is coupled between a common point at the drain of transistor 250 and the source of transistor of 252 and the source of transistor 254. The respective N-wells of the PMOS transistors in I/O buffer 200 are coupled to a floating N-well bias circuit 230. Floating N-well bias circuit 230 may comprise a PMOS transistor 232 with its gate coupled to the gate of PMOS transistor 252 and the source of NMOS transistor 222.

Two serial input inverters 244 and 246 are coupled to input transistor 228 and form an input path to provide a control signal 206 that may be used by the core circuit.

In operation during input mode (when output enable signal 202 is at a logic high or 3.3 volts, for example), an input path is formed from I/O pad 208, via resistor 258 and inverters 246 and 244. A feedback path is formed by transistors 228, 226, and 222 to node $V_{FBK}$. When I/O pad 208 is forced to a logic low level or 0 volts by a signal received from an external circuit, for example, the voltage level at node $V_{FBK}$ is also at a logic low level. This causes the floating N-wells of the PMOS transistors to be biased at 3.3 volts, for example if $V_{BIAS}$ is 3.3 volts. Transistor 228, being ON, passes the low logic level to node 227, which may then be provided to inverters 246 and 244 for passing on to the core circuit as an input or control signal. Both transistors 260 and 264 in output driver 218 are OFF during input mode.

When I/O pad 208 is forced to 3.3 volts during input mode, the voltage level at node $V_{FBK}$ may be about 2.7 volts due to the voltage drop across the feedback path. Accordingly, the N-well bias of the PMOS transistors is held at $V_{BIAS}$ or 3.3 volts.

When I/O pad 208 receives a 5-volt input signal, the voltage level $V_{FBK}$ may swing from 0 or 2.7 volts to about 5 volts. Thus, the floating N-wells are biased at 5 volts. Properly biasing the floating N-wells to the PMOS transistors avoids or minimizes over-voltage and leakage current problems in these transistors when a 5-volt input signal is present. These transistors also do not have gate oxide reliability issues. Transistors 250 and 252 also operate to protect pre-driver 210 when the input signal is at 5 volts. Transistor 252, in particular, is turned OFF by a high logic level at $V_{FBK}$.

In output mode, enable signal 202 is at a logic low and I/O buffer circuit 200 operates in an output mode. The output of inverter 240 passes through parallel transistors 250 and 252 to turn ON or OFF transistor 264 depending on the logic level of data input signal 204. The output of inverter 242 will also follow the logic level of data input signal 204 to turn ON or OFF transistors 260. When the output of inverter 240 is at a logic high or 3.3 volts when the data input signal is at a logic low, 3.3 volts are passed to the gate of transistor 264, and a logic high signal is provided to the gate of transistor 260. Thus, transistor 264 is turned ON, transistor 260 is turned OFF, and the signal present at I/O pad 208 becomes a logic high. On the other hand, if the data input signal is low, transistor 264 is turned OFF, transistor 260 is turned ON, and the signal present at I/O pad 208 becomes a logic low. The voltage level $V_{FBK}$ is also held at a low logic level to maintain the floating N-well bias at 3.3 volts. This enables fast tri-state response time. The output logic level at I/O pad 208 thus follows the logic level of data input signal 204.

Figure 4:
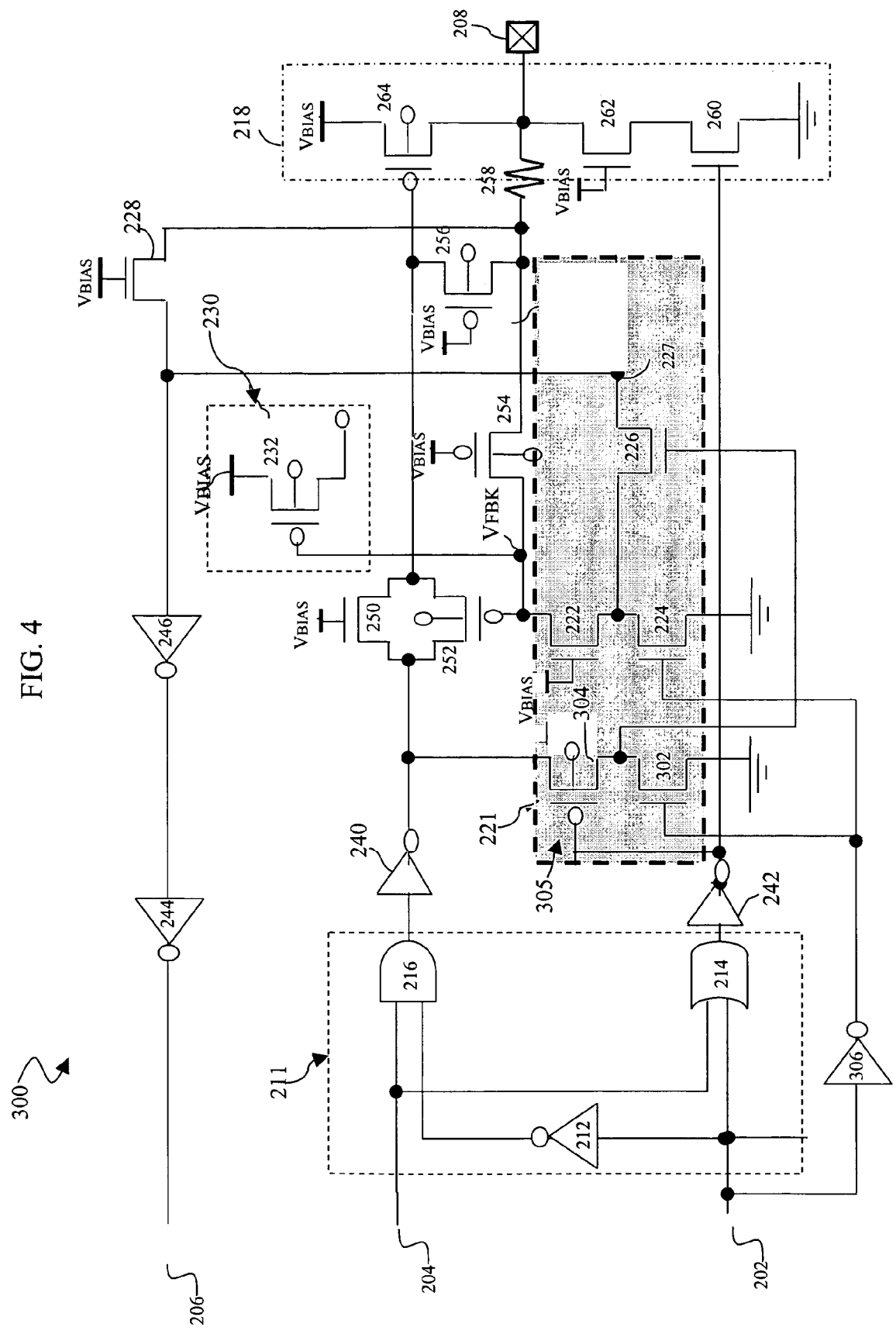
FIG. 4 is a schematic diagram of another embodiment of an input/output buffer circuit.

FIG. 4 is a schematic diagram of another embodiment of an I/O buffer circuit 300. I/O buffer circuit 300 comprises pre-driver and level-up shifter circuits 211 coupled to a feedback circuit 221 that is a modification of feedback circuit 220 of FIG. 3. Pre-driver and level-up shifter circuits 211 may provide the functionality of shifting voltage levels between a lower voltage level, such as 1.8 or 3.3 volts and a higher voltage level, such as 3.3 or 5 volts. Voltage level shifting is desirable if core circuit 104 (FIG. 1) operates at a low voltage level and external integrated circuits 106 (FIG. 1) operates at a higher voltage level. Feedback circuit 221 comprises NMOS transistors 222 and 224 coupled in series between the $V_{FBK}$ node and ground. The gate of transistor 222 is coupled to $V_{BIAS}$ and the gate of transistor 224 is coupled to the output of an inverter 306, the input of which is coupled to enable signal 202 prior to level shifting circuit 211. The output of inverter 306 is also coupled to the gate of an NMOS transistor 302 coupled in series with a PMOS transistor 304 forming a step-up circuit 305. The drain of transistor 304 is coupled to the output of inverter 242 and its substrate is coupled to floating N-well bias circuit 230. The gate of transistor 304 is coupled to enable signal 202 after pre-driver and level shifter circuits 211. The gate of transistor 226, rather than being coupled to the enable signal as in FIG. 3, is coupled to the output of step-up circuit 305 formed by transistors 304 and 302. Feedback circuit 221 also comprises NMOS transistor 228 coupled between feedback transistor 226 at node 227 and the source of transistor 256.

In operation, step-up circuit 305 performs a level-up function of output enable signal 202 prior to passing it on to feedback transistor 226. The input path during input mode is formed by I/O pad 208, resistor 258, transistor 228, and inverters 246 and 244. The output path during output mode is formed by inverter 240, pass gate transistors 250 and 252, and output buffer transistor 264. A feedback path is formed by transistors 226, 222, and 224.

In operation during input mode, enable signal 202 is at a logic high level. Transistor 302 is turned OFF, and transistor 304 is turned ON to pass a high logic level signal at the output of inverter 240 to the gate electrode of transistor 226 in the feedback path, turning it ON. When I/O pad 208 is forced to a logic low level by a signal received from an external circuit, for example, the voltage level $V_{FBK}$ at the is also at a logic low level. This causes the floating N-wells of the PMOS transistors to be biased at 3.3 volts, for example if $V_{BIAS}$ is 3.3 volts. Both transistors 260 and 264 in output driver 218 are OFF during input mode. Transistor 228, being ON, passes the low logic level to node 227, which may then be provided to inverters 246 and 244 for passing on to the core circuit as an input or control signal.

When I/O pad 208 is forced to 3.3 volts, the voltage level $V_{FBK}$ may be about 2.7 volts due to the voltage drop across transistor 254 and resistor 258, and still causes the N-well bias to be at $V_{BIAS}$ or 3.3 volts. When I/O pad 208 is forced to 5 volts, the voltage level $V_{FBK}$ may swing from 0 or 2.7 volts to about 5 volts. Properly biasing the floating N-wells to the PMOS transistors avoids or minimizes over-voltage and leakage current problems in these transistors. These transistors also do not have gate oxide reliability issues.

In output mode, enable signal 202 is at a logic low and I/O buffer circuit 200 operates in an output mode. The output of inverter 240 passes through parallel transistors 250 and 252 to turn ON or OFF transistor 264 depending on the logic level of data input signal 204. When the output of inverter 240 is at a logic high or 3.3 volts, 3.3 volts are passed to the gate of transistor 264. The output of inverter 242 will also follow the logic level of data input signal 204 to turn ON or OFF transistors 260. The voltage level $V_{FBK}$ is also held at a low logic level to maintain the floating N-well bias at 3.3 volts. This enables fast tri-state response time. The output logic level at I/O pad 208 thus follows the logic level of data input signal 204.

Circuits 200 and 300 use simple logic for properly biasing the floating N-wells of the PMOS transistors to minimize or eliminate over-voltage and leakage current problems. Further, a fast tri-state response is possible due to the properly biased floating N-wells. The feedback logic is simple and is operable to control pass gate transistor 252 to isolate the output path as well as providing the control signal to the floating N-well bias circuit. Further, the feedback path is short and reacts quickly to input voltage levels.

Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims. In the claims, means-plus-function clauses are intended to cover the structures described herein as performing the recited function and not only structural equivalents, but also equivalent structures.

What is claimed is:

1. An input/output buffer, comprising:
   an input/output pad operable to receive an input signal and transmit an output signal;
   an output driver coupled to the input/output pad;
   an input path comprising an input transistor coupled to the input/output pad operable to pass an input signal received at the input/output pad to a core circuit coupled to the input/output buffer;
   an output path coupled to the output driver operable to pass an output signal received from the core circuit to the input/output pad;
   a feedback path coupled to the input transistor in the input path and operable to cut off the output path during input mode when the feedback path is enabled; and
   a biasing circuit coupled to selected transistors in the output path, feedback path and output driver, wherein the feedback path comprises:
   a feedback transistor coupled to the input transistor operable to disable the feedback path during output mode; and
   a pair of serially-coupled transistors coupled to a pass gate in the output path and the feedback transistor and operable to control the pass gate in response to the input signal.

2. An input/output buffer, comprising:
   an input/output pad operable to receive an input signal and transmit an output signal;
   an output driver coupled to the input/output pad;
   an input path comprising an input transistor coupled to the input/output pad operable to pass an input signal received at the input/output pad to a core circuit coupled to the input/output buffer;
   an output path coupled to the output driver operable to pass an output signal received from the core circuit to the input/output pad;
   a feedback path coupled to the input transistor in the input path and operable to cut off the output path during input mode; and
   a biasing circuit coupled to selected transistors in the output path, feedback path and output driver, wherein the biasing circuit comprises a PMOS transistor coupled at its gate to the feedback path, the biasing circuit is operable to bias floating N-wells of PMOS transistors in the output path, feedback path and output driver.

3. An input/output buffer, comprising:
   an input/output pad operable to receive an input signal and transmit an output signal;
   an output driver coupled to the input/output pad;
   an input path comprising an input transistor coupled to the input/output pad operable to pass an input signal received at the input/output pad to a core circuit coupled to the input/output buffer;
   an output path coupled to the output driver operable to pass an output signal received from the core circuit to the input/output pad;
   a feedback path coupled to the input transistor in the input path and operable to cut off the output path during input mode when the feedback path is enabled; and
   a biasing circuit coupled to selected transistors in the output path, feedback path and output driver wherein the feedback path comprises:
   a feedback transistor coupled to the input transistor operable to disable the feedback path during output mode; and
   a pair of serially-coupled transistors coupled to a pass gate in the output path and the feedback transistor and operable to control the pass gate in response to the input signal, and further coupled to the biasing circuit.

4. The input/output buffer, as set forth in claim 2, wherein the feedback path comprises:
   a feedback transistor coupled to the input transistor operable to disable the feedback path during output mode;
   a pair of serially-coupled transistors coupled to a pass gate in the output path and the feedback transistor and operable to control the pass gate in response to the input signal; and
   a step-up circuit coupled to the output path and operable to level-shift a control signal to the feedback transistor.

5. The input/output buffer, as set forth in claim 2, wherein the feedback path comprises:
   a feedback transistor coupled to the input transistor operable to disable the feedback path during output mode;
   a pair of serially-coupled transistors coupled to a pass gate in the output path and the feedback transistor and operable to control the pass gate in response to the input signal, and further coupled to the biasing circuit; and
   a step-up circuit coupled to the output path and operable to level-shift a control signal to the feedback transistor.

6. The input/output buffer, as set forth in claim 4, wherein the step-up circuit comprises:
   a PMOS transistor with its drain coupled to the output path, and its gate coupled to an inverted and up-shifted output enable signal;
   an NMOS transistor with its source coupled to a source of the PMOS transistor and the gate of the feedback transistor, its gate coupled to an inverted output enable signal.

7. The input/output buffer, as set forth in claim 1, wherein the output driver comprises:
   a PMOS transistor coupled between a supply voltage and the input/output pad;
   an NMOS transistor having a gate receiving an inverted output enable signal;
   a cascade transistor coupled between the input/output pad and the NMOS transistor.

8. The input/output buffer, as set forth in claim 1, wherein the input path comprises:
   an input transistor coupled to the input/output pad;

a first inverter coupled to the input transistor; and a second inverter coupled to the output of the first inverter.

9. The input/output buffer, as set forth in claim 8, wherein the input path further comprises a resistor coupled between the input/output pad and the input transistor.

10. The input/output buffer, as set forth in claim 2, wherein the output path comprises:

a pass gate receiving a data signal;

a PMOS transistor coupled between a supply voltage and the input/output pad, its gate coupled to the pass gate, and its substrate coupled to the biasing circuit.

11. An integrated circuit having at least one input/output circuit, comprising:

an output driver coupled to an input/output pad and operable to provide an output signal to the input/output pad;

an input path comprising an input transistor coupled to the input/output pad operable to receive an input signal received at the input/output pad;

an output path coupled to the output driver operable to pass an output signal to the input/output pad;

a feedback circuit operable to cut off the output path during input mode, the feedback circuit including a feedback transistor coupled to the input transistor operable to disable a feedback path during output mode, and a pair of serially-coupled transistors coupled to a pass gate in the output path and the feedback transistor and operable to control the pass gate in response to the input signal, wherein the feedback circuit is operable to cut off the output path during input mode when the feedback transistor is enabled; and a biasing circuit coupled to selected transistors in the output path, feedback circuit and output driver.

12. An integrated circuit having at least one input/output circuit, comprising:

an output driver coupled to an input/output pad and operable to provide an output signal to the input/output pad;

an input path comprising an input transistor coupled to the input/output pad operable to receive an input signal received at the input/output pad;

an output path coupled to the output driver operable to pass an output signal to the input/output pad;

a feedback circuit operable to cut off the output path during input mode, the feedback circuit including a feedback transistor coupled to the input transistor operable to disable the feedback path during output mode, and a pair of serially-coupled transistors coupled to a pass gate in the output path and the first transistor and operable to control the pass gate in response to the input signal; and a biasing circuit coupled to selected transistors in the output path, feedback circuit and output driver, wherein the biasing circuit comprises a PMOS transistor coupled at its gate to the feedback path, the biasing circuit is operable to bias floating N-wells of PMOS transistors in the output path, feedback circuit and output driver.

13. The integrated circuit, as set forth in claim 11, wherein the pair of serially-coupled transistors is further coupled to the biasing circuit.

14. The integrated circuit, as set forth in claim 12, wherein the feedback circuit further comprises a step-up circuit coupled to the output path and operable to level-shift a control signal to the feedback transistor.

15. The integrated circuit, as set forth in claim 14, wherein the step-up circuit comprises:

a PMOS transistor with its drain coupled to the output path, and its gate coupled to an inverted and up-shifted output enable signal;

an NMOS transistor with its source coupled to a source of the PMOS transistor and the gate of the feedback transistor, its gate coupled to an inverted output enable signal.

16. The integrated circuit, as set forth in claim 11, wherein the output driver comprises:

a PMOS transistor coupled between a supply voltage and the input/output pad;

an NMOS transistor having a gate receiving an inverted output enable signal;

a cascade transistor coupled between the input/output pad and the NMOS transistor.

17. The integrated circuit, as set forth in claim 11, wherein the input path comprises:

an input transistor coupled to the input/output pad;

a first inverter coupled to the input transistor; and a second inverter coupled to the output of the first inverter.

18. The integrated circuit, as set forth in claim 17, wherein the input path further comprises a resistor coupled between the input/output pad and the input transistor.

19. The integrated circuit, as set forth in claim 12, wherein the output path comprises:

a pass gate receiving a data signal;

a PMOS transistor coupled between a supply voltage and the input/output pad, its gate coupled to the pass gate, and its substrate coupled to the biasing circuit.

* * * * *